US011588260B2

(12) United States Patent
Chen

(10) Patent No.: US 11,588,260 B2
(45) Date of Patent: Feb. 21, 2023

(54) POWER SUPPLY DEVICE AND CONDUCTIVE SPRING CONTACT THEREOF

(71) Applicant: DELTA ELECTRONICS, INC., Taoyuan (TW)

(72) Inventor: Tsun-Sung Chen, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 2 days.

(21) Appl. No.: 17/229,883

(22) Filed: Apr. 14, 2021

(65) Prior Publication Data

US 2022/0077611 A1   Mar. 10, 2022

(30) Foreign Application Priority Data

Sep. 8, 2020   (CN) .......................... 202010935523.0

(51) Int. Cl.
| | | |
|---|---|---|
| *H01R 12/72* | (2011.01) | |
| *H01R 12/70* | (2011.01) | |
| *H01R 13/631* | (2006.01) | |
| *H01R 13/02* | (2006.01) | |
| *H05K 5/00* | (2006.01) | |
| *H05K 1/11* | (2006.01) | |
| *H01R 24/68* | (2011.01) | |
| *H01R 103/00* | (2006.01) | |

(52) U.S. Cl.
CPC ....... *H01R 12/721* (2013.01); *H01R 12/7088* (2013.01); *H01R 13/02* (2013.01); *H01R 13/631* (2013.01); *H05K 5/006* (2013.01); *H05K 5/0069* (2013.01); *H01R 24/68* (2013.01); *H01R 2103/00* (2013.01); *H05K 1/119* (2013.01); *H05K 2201/09163* (2013.01)

(58) Field of Classification Search
CPC .. H01R 12/721; H01R 12/7088; H01R 13/02; H01R 13/631; H01R 24/68; H01R 2103/00; H05K 5/006; H05K 5/0069; H05K 1/119; H05K 2201/09163
USPC .......................................................... 439/59
See application file for complete search history.

(56) References Cited

U.S. PATENT DOCUMENTS 6,644,984 B2 * 11/2003 Vista, Jr. ................ H01R 12/58
                                                                   439/76.1
6,851,955 B2 *  2/2005 Chen .................. H01R 13/6658
                                                                     439/84

(Continued)

FOREIGN PATENT DOCUMENTS

CN        2179640 Y  * 10/1994 ............. H01R 23/70
CN     101436725 B  *  9/2010

(Continued)

*Primary Examiner* — Peter G Leigh
(74) *Attorney, Agent, or Firm* — CKC & Partners Co., LLC

(57) ABSTRACT

A power supply device includes a housing, a circuit board and a conductive spring contact. The housing has a receiving structure. The circuit board is disposed in the housing. The conductive spring contact is disposed in the receiving structure and includes a base portion, a contact portion and a curved portion. The contact portion is connected to the base portion and is bent relative to the base portion. The contact portion extends between the circuit board and a wall portion of the receiving structure, and the contacts the circuit board. The curved portion is connected to the contact portion and abuts against the wall portion.

12 Claims, 5 Drawing Sheets

(56) References Cited

U.S. PATENT DOCUMENTS

| | | | | |
|---|---|---|---|---|
| 7,503,779 B1* | 3/2009 | Yang | ...................... | H01R 35/04 |
| | | | | 439/131 |
| 7,637,783 B2* | 12/2009 | Sasaoka | ............... | H01R 12/721 |
| | | | | 439/862 |
| 7,794,251 B2* | 9/2010 | Wen | ...................... | H01R 27/00 |
| | | | | 439/171 |
| 8,267,705 B2* | 9/2012 | Huang | ................... | H01R 31/06 |
| | | | | 439/171 |
| 8,672,713 B2* | 3/2014 | Tajiri | ................... | H01R 12/716 |
| | | | | 439/630 |
| 9,325,098 B2* | 4/2016 | Chen | ...................... | H01R 13/44 |
| 9,343,835 B2* | 5/2016 | Sasaki | ................... | H01R 13/04 |
| 9,608,349 B2* | 3/2017 | Mashiyama | ....... | H01R 13/2492 |
| 2004/0110397 A1 | 6/2004 | Chen | | |
| 2009/0117765 A1* | 5/2009 | Wen | ..................... | H01R 13/514 |
| | | | | 439/166 |
| 2018/0097320 A1* | 4/2018 | Hashiguchi | ........ | H01R 13/2492 |

FOREIGN PATENT DOCUMENTS

| | | | | | |
|---|---|---|---|---|---|
| CN | 102544844 B | * | 7/2015 | ......... | H01R 13/5216 |
| CN | 103682759 B | * | 5/2016 | ........... | H01R 12/721 |
| CN | 207490163 U | * | 6/2018 | | |
| CN | 210468223 U | | 5/2020 | | |
| EP | 2093841 A2 | * | 8/2009 | ........... | H01R 12/716 |
| JP | 2021108286 A | * | 7/2021 | | |
| TW | 226795 | | 7/1994 | | |
| TW | 201121179 A1 | | 6/2011 | | |
| TW | M493761 U | | 1/2015 | | |
| TW | 560731 U | * | 5/2018 | | |
| TW | M560731 U | | 5/2018 | | |

\* cited by examiner

POWER SUPPLY DEVICE AND CONDUCTIVE SPRING CONTACT THEREOF

RELATED APPLICATIONS

This application claims priority to China Application Serial Number 202010935523.0, filed Sep. 8, 2020, the disclosure of which is incorporated herein by reference in its entirety.

BACKGROUND

Technical Field

The present disclosure relates to a power supply device and conductive spring contact thereof.

Description of Related Art

Conductive spring contacts are commonly found in electronic apparatus for electrically connecting electronic components. Loose contact is a problem frequently encountered when using conductive spring contacts. The inability of conductive spring contacts to make contact with electronic components resulting from elastic fatigue is a major cause of loose contact. This problem in in urgent need of an effective solution.

SUMMARY

In view of the foregoing, one of the objects of the present disclosure is to provide a novel power supply device and conductive spring contact to resolve the aforementioned problem.

To achieve the objective stated above, in accordance with an embodiment of the present disclosure, a power supply device includes a housing, a circuit board and a conductive spring contact. The housing has a receiving structure. The circuit board is disposed in the housing. The conductive spring contact is disposed in the receiving structure and includes a base portion, a first contact portion and a curved portion. The first contact portion is connected to the base portion and is bent relative to the base portion. The first contact portion extends between the circuit board and a wall portion of the receiving structure, and the contacts the circuit board. The curved portion is connected to the first contact portion and abuts against the wall portion.

In one or more embodiments of the present disclosure, the curved portion is connected to a top end of the first contact portion and curves away from the circuit board.

In one or more embodiments of the present disclosure, the first contact portion includes at least one contact band for contacting the circuit board and an incline located between the base portion and the contact band.

In one or more embodiments of the present disclosure, the first contact portion includes a slit and two contact bands. The two contact bands are located on two sides of the slit respectively.

In one or more embodiments of the present disclosure, the conductive spring contact further includes a second contact portion extending from the base portion. The first contact portion and the second contact portion contacts two opposite faces of the circuit board respectively.

In one or more embodiments of the present disclosure, the second contact portion includes an inclined section. The inclined section is located on an end of the second contact portion away from the base portion.

In one or more embodiments of the present disclosure, the receiving structure has at least one interlocking feature in proximity to the conductive spring contact and configured to interlock with the circuit board.

In accordance with an embodiment of the present disclosure, a conductive spring contact for a power supply device which includes a housing and a circuit board is provided. The conductive spring contact includes a base portion, a first contact portion and a curved portion. The first contact portion is connected to the base portion and is bent relative to the base portion. The first contact portion has a contact surface configured to contact the circuit board. The curved portion is connected to a top end of the first contact portion and curves away from the contact surface. The curved portion is configured to abut against the housing.

In sum, the conductive spring contact of the present disclosure is provided with a curved portion which is connected to the contact portion and is configured to abut against the housing of the device. The position limiting effect of the housing, along with the elasticity of the curved portion, can keep the contact portion of the spring contact and the circuit board in contact to prevent the issue of loose contact.

BRIEF DESCRIPTION OF THE DRAWINGS

To make the objectives, features, advantages, and embodiments of the present disclosure, including those mentioned above and others, more comprehensible, descriptions of the accompanying drawings are provided as follows.

DETAILED DESCRIPTION

Figure 1:
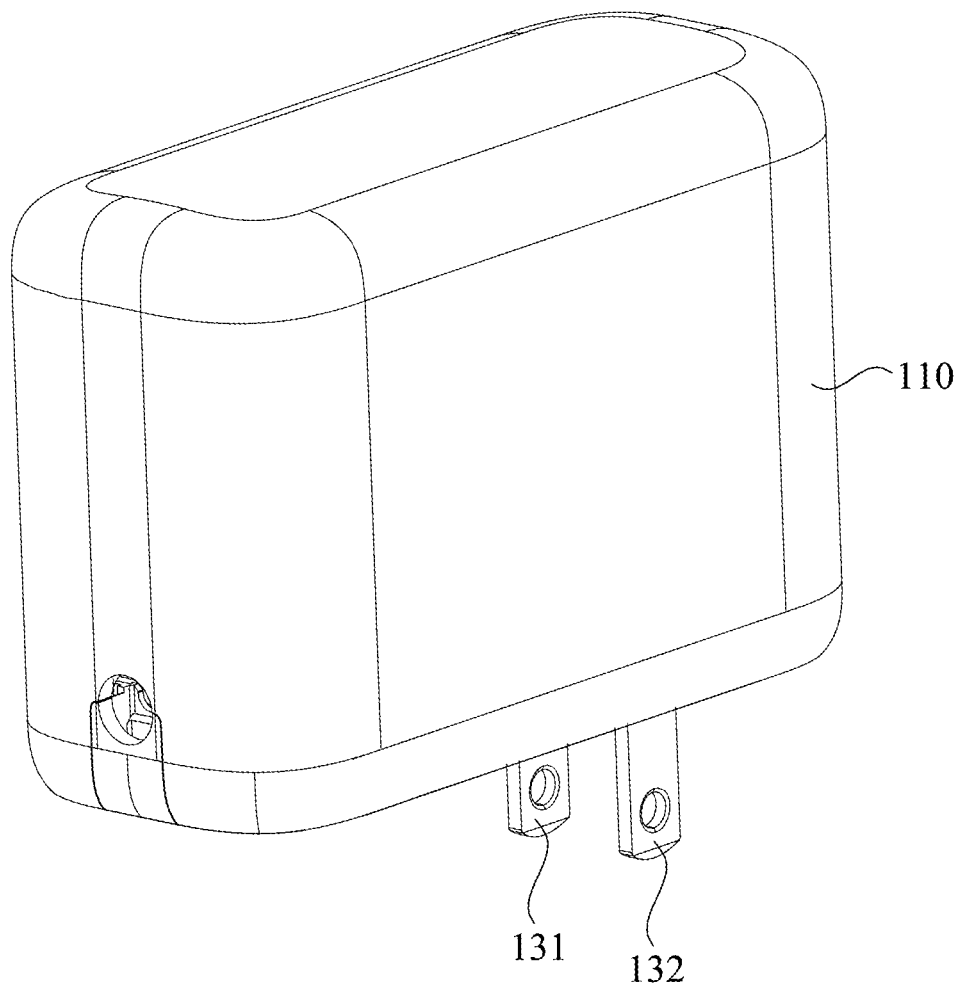
FIG. 1 illustrates an assembled view of a power supply device in accordance with an embodiment of the present disclosure.

For the completeness of the description of the present disclosure, reference is made to the accompanying drawings and the various embodiments described below. Various features in the drawings are not drawn to scale and are provided for illustration purposes only. To provide full understanding of the present disclosure, various practical details will be explained in the following descriptions. However, a person with an ordinary skill in relevant art should realize that the present disclosure can be implemented without one or more of the practical details. Therefore, the present disclosure is not to be limited by these details.

Figure 2:
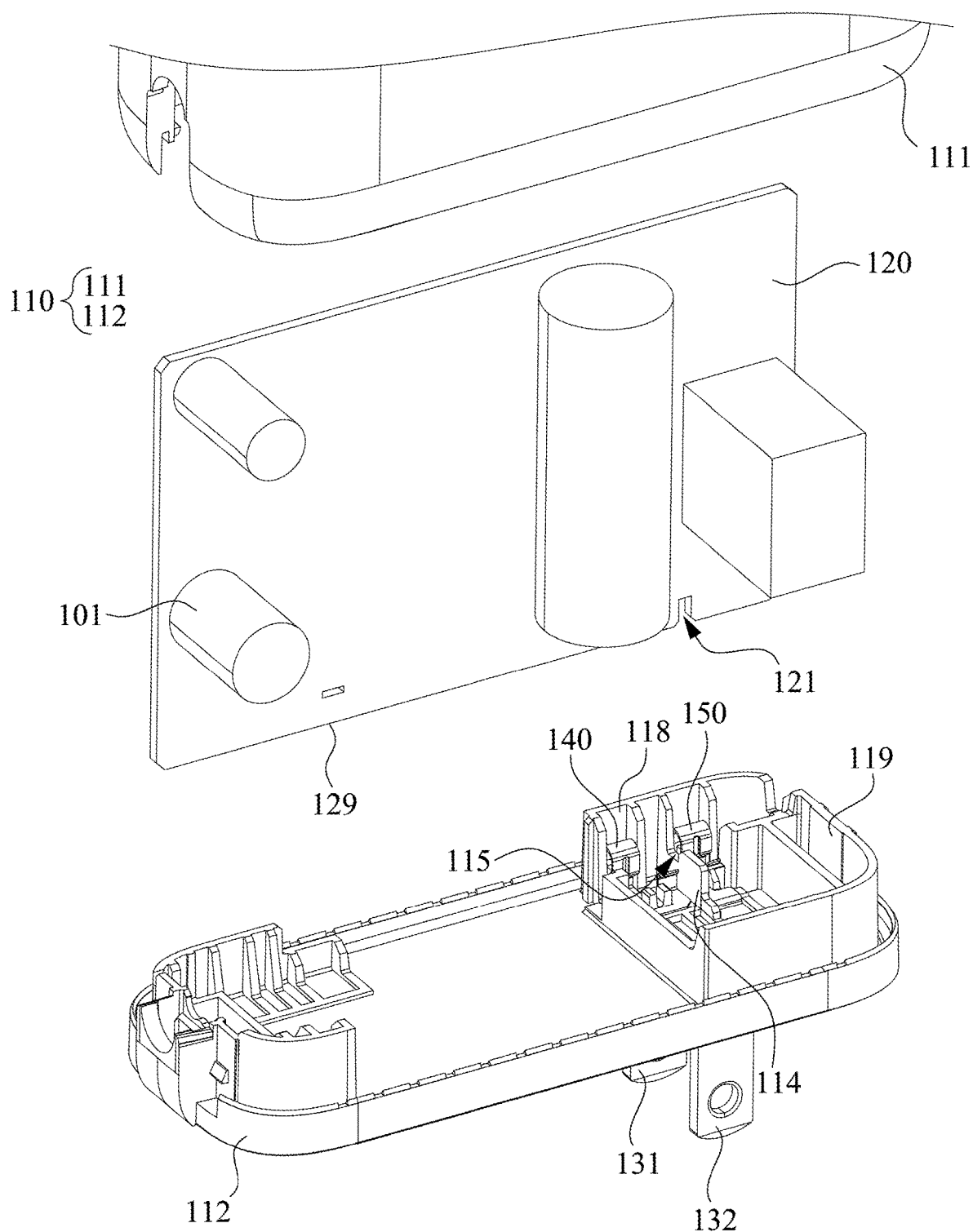
FIG. 2 illustrates an exploded view of the power supply device shown in FIG. 1.

Reference is made to FIGS. 1 and 2. FIG. 1 illustrates an assembled view of a power supply device 100 in accordance with an embodiment of the present disclosure. FIG. 2 illustrates an exploded view of the power supply device 100 shown in FIG. 1. The power supply device 100 includes a housing 110, a circuit board 120, two conductive pins 131 and 132, and two conductive spring contacts 140 and 150.

The housing 110 is a hollow structure. The circuit board 120 is disposed in the housing 110 and is configure to carry at least one electronic component 101. The conductive pins 131 and 132 are disposed on the housing 110 and are at least partially exposed outside the housing 110. In some embodiments, the power supply device 100 is a wall-mounted power supply device, and the conductive pins 131 and 132 are to be inserted into a power socket.

Following the discussion in the previous paragraph, the housing 110 has a receiving structure 119. The receiving structure 119 is in the interior of the housing 110. The conductive spring contacts 140 and 150 are disposed in the receiving structure 119 and are configured to be fixedly connected with the conductive pins 131 and 132 respectively. The conductive spring contacts 140 and 150 are also configured to contact the circuit board 120. In other words, the conductive pins 131 and 132 are electrically connected to the circuit board 120 via the conductive spring contacts 140 and 150. In some embodiments, the conductive spring contacts 140 and 150 include metallic material.

As shown in FIG. 2, in some embodiments, the circuit board 120 has a plurality of electrical contacts (not depicted). The electrical contacts are positioned on at least one surface of the circuit board 120. The conductive spring contacts 140 and 150 are configured to contact the electrical contacts of the circuit board 120. In some embodiments, the housing 110 includes a first housing component 111 and a second housing component 112. The first housing component 111 and the second housing component 112 are assembled to form the housing 110.

Figure 3:
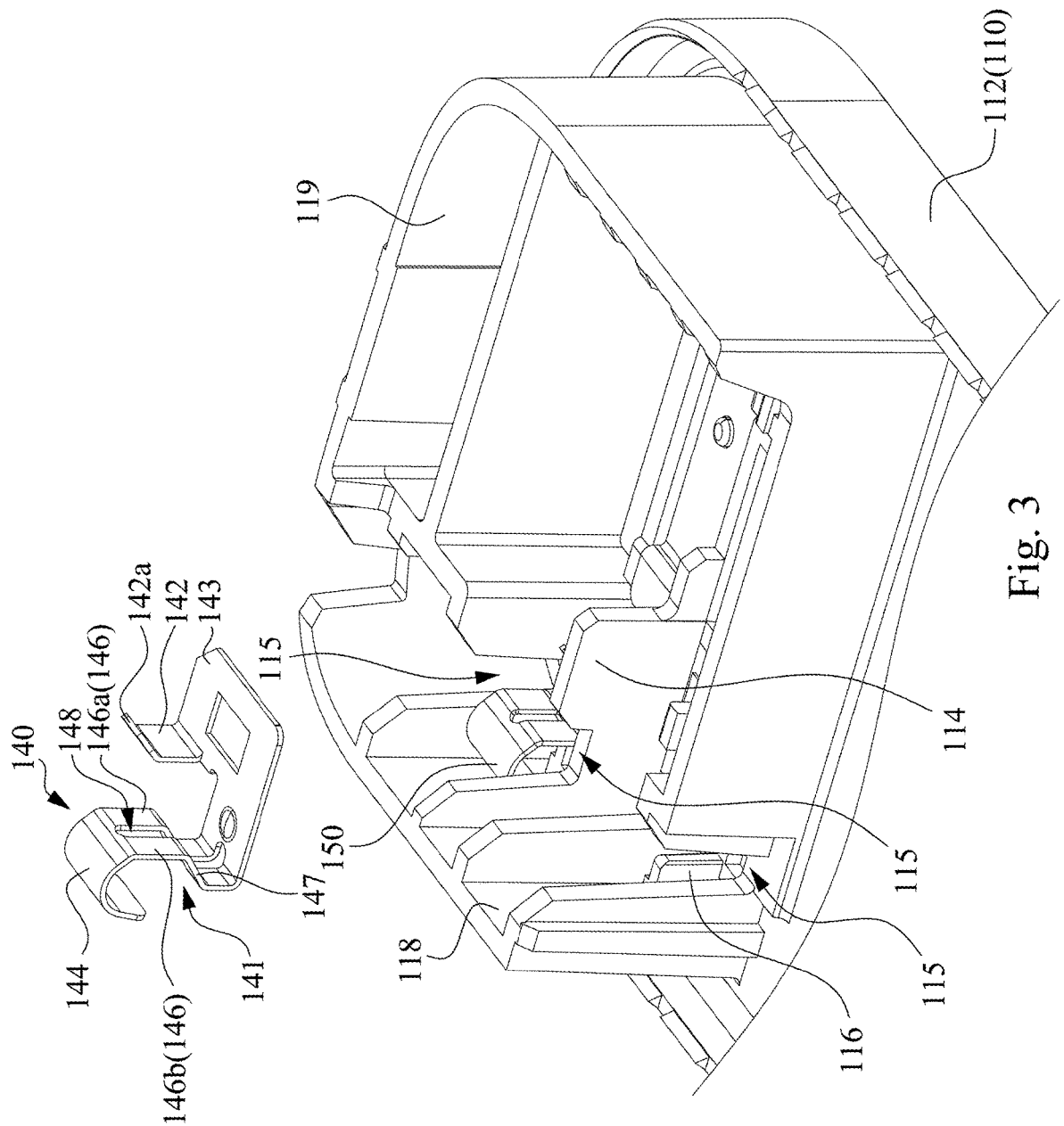
FIG. 3 illustrates an enlarged view of the conductive spring contact and the housing shown in FIG. 2 being separated.
Figure 4:
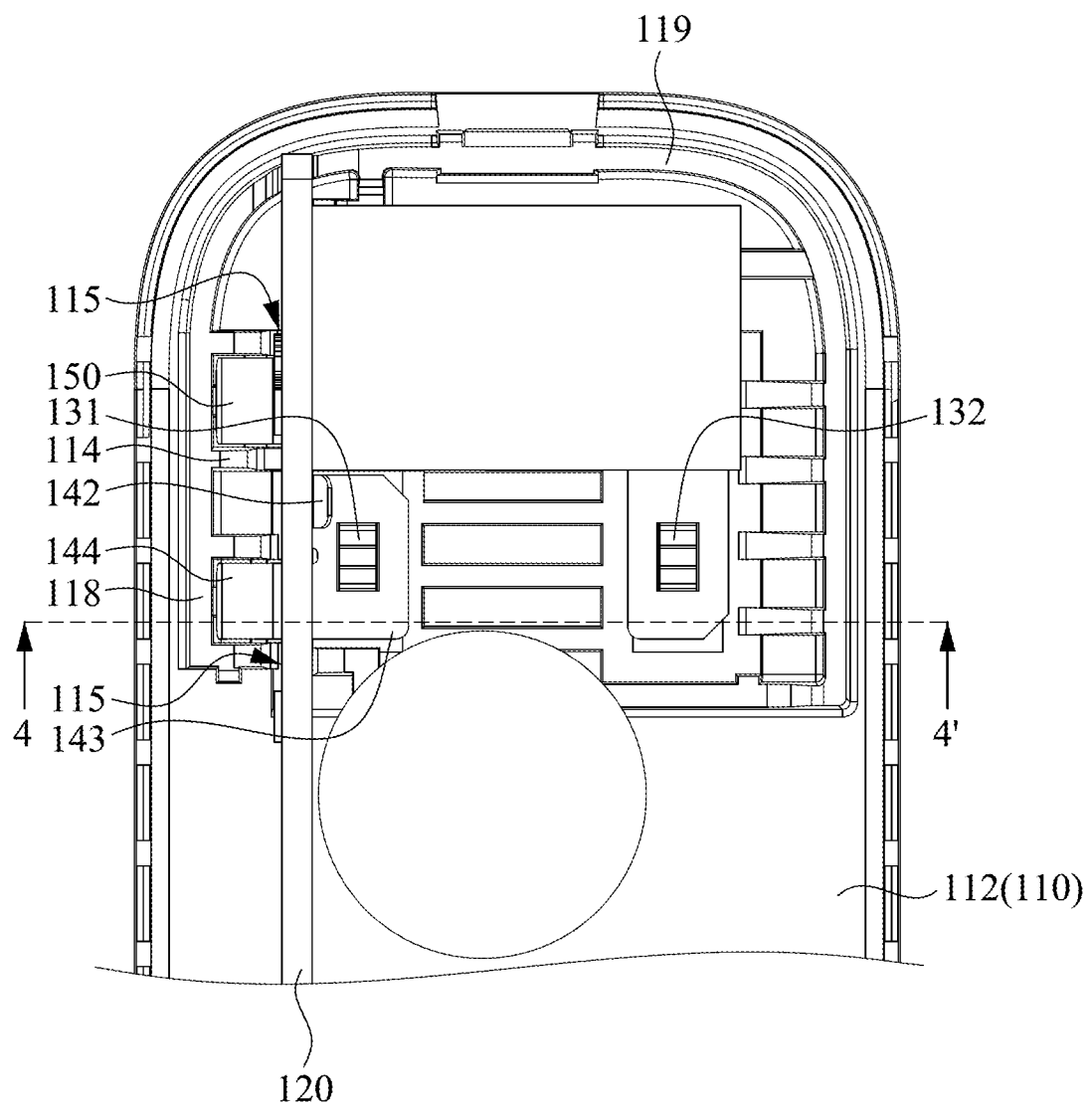
FIG. 4 illustrates an enlarged top view of some components of the power supply device shown in FIG. 1.
Figure 5:
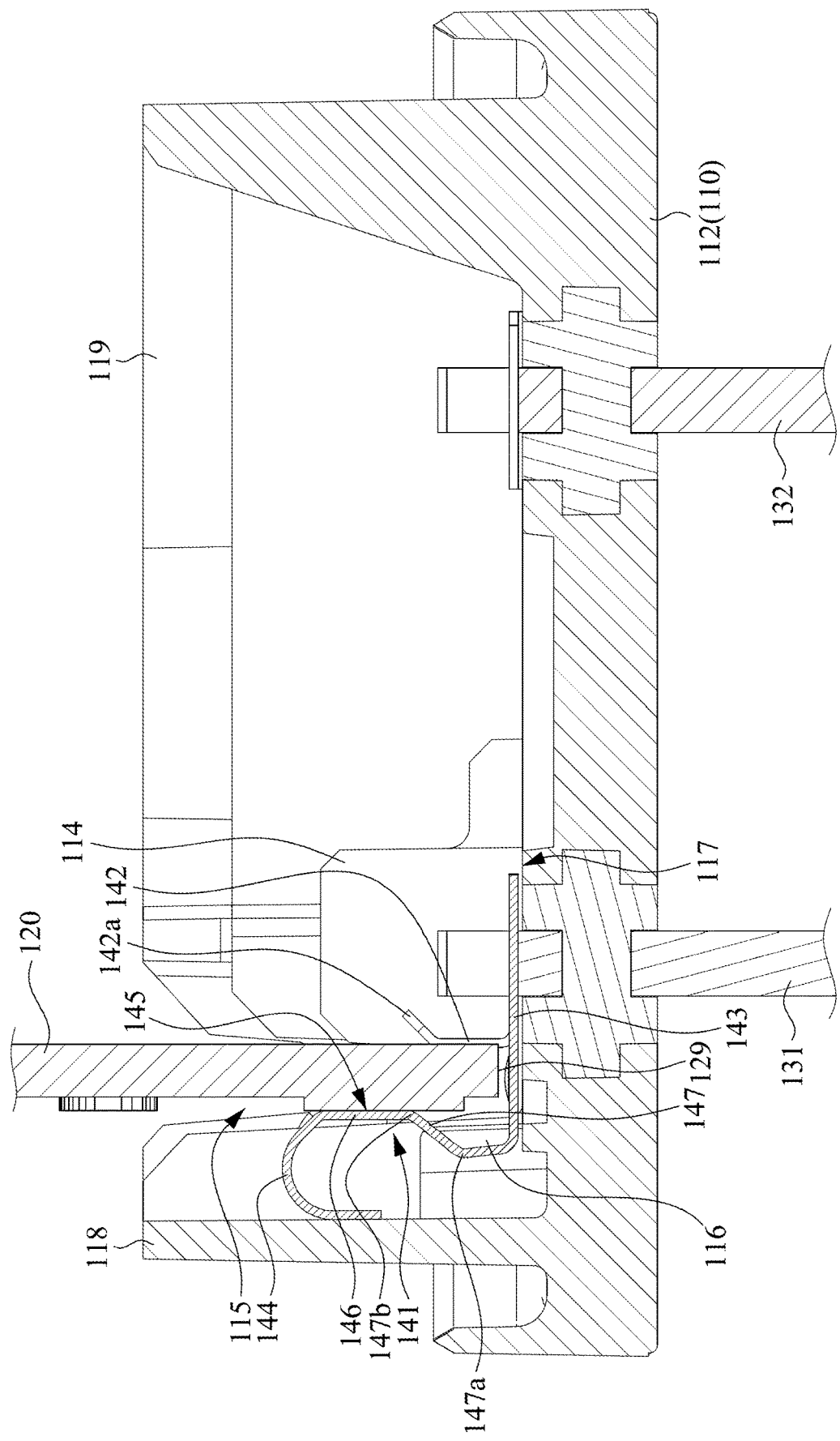
FIG. 5 illustrates an enlarged cross-sectional view of the power supply device shown in FIG. 4 along the line segment 4-4'.

Reference is made to FIGS. 3 to 5. The conductive spring contact 140 includes a base portion 143, a first contact portion 141 and a curved portion 144. The base portion 143 is disposed on a bottom surface 117 of the receiving structure 119 and faces an edge 129 of the circuit board 120. The conductive pin 131 passes through the housing 110 and partially extends into the receiving structure 119. The conductive pin 131 is fixedly connected the base portion 143 of the conductive spring contact 140. The first contact portion 141 is connected to the base portion 143 and is bent relative to the base portion 143. Specifically, the first contact portion 141 extends in a direction away from the bottom surface 117 of the receiving structure 119. The first contact portion 141 is configured to contact the circuit board 120.

Following the discussion in the previous paragraph, the first contact portion 141 extends between the circuit board 120 and a wall portion 118 of the receiving structure 119. The first contact portion 141 has a contact surface 145 configured to contact the circuit board 120. The curved portion 144 is connected to the first contact portion 141. Specifically, the curved portion 144 is connected to a top end of the first contact portion 141 (i.e., the end of the first contact portion 141 away from the base portion 143) and curves away from the contact surface 145 and the circuit board 120 to abut against the wall portion 118 of the receiving structure 119. The position limiting effect of the wall portion 118 of the receiving structure 119, along with the elasticity of the curved portion 144, can keep the conductive spring contact 140 and the circuit board 120 in contact to prevent the issue of loose contact. In some embodiments, the curved portion 144 has a concave surface facing towards the bottom surface 117 of the receiving structure 119.

In some embodiments, when the circuit board 120 is removed, the conductive spring contact 140 and the wall portion 118 of the receiving structure 119 keep a gap therebetween. The conductive spring contact 140 is pushed backward by the circuit board 120 as circuit board 120 is inserted, such that the curved portion 144 of the conductive spring contact 140 abuts against the wall portion 118 of the receiving structure 119.

As shown in FIGS. 3 to 5, in some embodiments, the first contact portion 141 includes at least one contact band 146 for contacting the circuit board 120 and an incline 147 located between the base portion 143 and the contact band 146. Specifically, the incline 147 has a first end 147a and a second end 147b opposite to the first end 147a. The first end 147a is located between the second end 147b and the base portion 143. A distance from the first end 147a to the wall portion 118 is less than a distance from the second end 147b to the wall portion 118. The contact band 146 is connected to the second end 147b of the incline 147. When the first contact portion 141 is provided with the incline 147, the curved portion 144 may designed to have greater width, and elastic fatigue of the conductive spring contact 140 may be prevented accordingly.

As shown in FIGS. 3 to 5, in some embodiments, the first contact portion 141 includes a slit 148. The slit 148 runs through the first contact portion 141 and defines two contact bands 146a and 146b. The contact bands 146a and 146b are located on two sides of the slit 148 respectively. The contact bands 146a and 146b are configured to contact two electrical contacts of the circuit board 120 (not depicted). Under the multi-contact-band configuration, the likelihood of loose contact between the conductive spring contact 140 and the circuit board 120 may be lowered, as the conductive spring contact 140 and the circuit board 120 remain electrically connected as long as one of the contact bands 146a and 146b is in contact with the circuit board 120.

As shown in FIGS. 3 to 5, in some embodiments, the wall portion 118 of the receiving structure 119 has a rib structure 116 that extends into the slit 148 and engages the slit 148. A height of the rib structure 116 measured from the bottom surface 117 of the receiving structure 119 is less than heights of the contact bands 146a and 146b measured from the bottom surface 117.

As shown in FIGS. 3 to 5, in some embodiments, the conductive spring contact 140 further includes a second contact portion 142 extending from the base portion 143. The circuit board 120 is configured to be inserted into a space between the first contact portion 141 and the second contact portion 142, and the first contact portion 141 and the second contact portion 142 are configured to contact two opposite faces of the circuit board 120 respectively. In such embodiments, the circuit board 120 is a double sided PCB, and the first contact portion 141 and the second contact portion 142 are configured to make contact with electrical contacts on the two opposite faces of the circuit board 120 respectively. As the conductive spring contact 140 can make contact with the circuit board 120 from both sides, the likelihood of loose contact between the conductive spring contact 140 and the circuit board 120 may be lowered. In some embodiments, the circuit board 120 is clamped by the first and second contact portions 141 and 142.

As shown in FIGS. 3 to 5, in some embodiments, the second contact portion 142 includes an inclined section 142a. The inclined section 142a is located on an end of the second contact portion 142 away from the base portion 143. In other words, the top end of the second contact portion 142 is bent away from the circuit board 120 to form the inclined section 142a.

When installing the circuit board 120, if the circuit board 120 is slightly off position, the circuit board 120 would first contact the inclined section 142a as the circuit board 120 is moved downward. Under the guidance of the inclined section 142a, the circuit board 120 can successfully enter the space between the first contact portion 141 and the second contact portion 142, and makes contact with the first contact portion 141 and the second contact portion 142.

It should be noted that although the foregoing discussions mainly focus on the structure of the conductive spring contact 140, in some embodiments, the conductive spring contact 150 may include some or all of the structural features of the conductive spring contact 140. For the conciseness of this text, detailed discussions regarding the structure of the conductive spring contact 150 are left out.

As shown in FIGS. 3 to 5, in some embodiments, the receiving structure 119 has at least one interlocking feature 115 (e.g., a cutout) in proximity to the conductive spring contacts 140 and 150 and configured to interlock with the circuit board 120. The interlocking feature 115 may hold the circuit board 120, thereby ensuring that the circuit board 120 and the conductive spring contacts 140 and 150 are stably in contact. In some embodiment, the interlocking feature 115 is aligned with the space between the first contact portion 141 and the second contact portion 142.

Returning to FIG. 2. In some embodiments, the receiving structure 119 has a partition 114 between the conductive spring contacts 140 and 150. The edge 129 of the circuit board 120 has a notch 121 configured to engage with the partition 114. In some embodiments, the partition 114 has the interlocking feature 115 which interlocks with the notch 121 of the circuit board 120.

In sum, the conductive spring contact of the present disclosure is provided with a curved portion which is connected to the contact portion and is configured to abut against the housing of the device. The position limiting effect of the housing, along with the elasticity of the curved portion, can keep the contact portion of the spring contact and the circuit board in contact to prevent the issue of loose contact.

Although the present disclosure has been described by way of the exemplary embodiments above, the present disclosure is not to be limited to those embodiments. Any person skilled in the art can make various changes and modifications without departing from the spirit and the scope of the present disclosure. Therefore, the protective scope of the present disclosure shall be the scope of the claims as attached.

What is claimed is:

1. A power supply device, comprising:
a housing having a receiving structure;
a circuit board disposed in the housing; and
a conductive spring contact disposed in the receiving structure and comprising:
a base portion;
a curved portion; and
a first contact portion connected between the base portion and the curved portion, and being bent relative to the base portion, wherein the first contact portion extends between the circuit board and a wall portion of the receiving structure, and the first contact portion contacts the circuit board;
wherein the curved portion extends from a side of the first contact portion and away from the circuit board, and the curved portion abuts against the wall portion.

2. The power supply device of claim 1, wherein the curved portion is connected to a top end of the first contact portion and curves away from the circuit board.

3. The power supply device of claim 1, wherein the first contact portion comprises at least one contact band for contacting the circuit board and an incline located between the base portion and the contact band.

4. The power supply device of claim 1, wherein the first contact portion comprises a slit and two contact bands, and the two contact bands are located on two sides of the slit respectively.

5. The power supply device of claim 1, wherein the conductive spring contact further comprises a second contact portion extending from the base portion, the first contact portion and the second contact portion contacts two opposite faces of the circuit board respectively.

6. The power supply device of claim 5, wherein the second contact portion comprises an inclined section, and the inclined section is located on an end of the second contact portion away from the base portion.

7. The power supply device of claim 1, wherein the receiving structure has at least one interlocking feature in proximity to the conductive spring contact and configured to interlock with the circuit board.

8. A conductive spring contact for a power supply device, the power supply device comprising a housing and a circuit board, the conductive spring contact comprising:
a base portion;
a curved portion; and
a first contact portion connected between the base portion and the curved portion, and being bent relative to the base portion, wherein the first contact portion has a contact surface configured to contact the circuit board;
wherein the curved portion extends from a top end of the first contact portion and away from the contact surface, and the curved portion is configured to abut against the housing.

9. The conductive spring contact of claim 8, wherein the first contact portion comprises at least one contact band for contacting the circuit board and an incline located between the base portion and the contact band.

10. The conductive spring contact of claim 8, wherein the first contact portion comprises a slit and two contact bands, and the two contact bands are located on two sides of the slit respectively.

11. The conductive spring contact of claim 8, further comprising a second contact portion, the second contact portion extending from the base portion, wherein the first contact portion and the second contact portion are configured to contact two opposite faces of the circuit board respectively.

12. The conductive spring contact of claim 11, wherein the second contact portion comprises an inclined section, and the inclined section is located on an end of the second contact portion away from the base portion.

* * * * *